(12) United States Patent
Ye

(10) Patent No.: US 11,937,469 B2
(45) Date of Patent: Mar. 19, 2024

(54) ORGANIC LIGHT-EMITTING DISPLAY INTEGRATING ANTENNA TRACE AND MANUFACTURING METHOD THEREOF

(71) Applicant: WUHAN CHINA STAR OPTOELECTRONICS SEMICONDUCTOR DISPLAY TECHNOLOGY CO., LTD, Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 815 days.

(21) Appl. No.: 16/964,812

(22) PCT Filed: Jun. 10, 2020

(86) PCT No.: PCT/CN2020/095448
§ 371 (c)(1),
(2) Date: Jul. 24, 2020

(87) PCT Pub. No.: WO2021/217793
PCT Pub. Date: Nov. 4, 2021

(65) Prior Publication Data
US 2023/0157093 A1 May 18, 2023

(30) Foreign Application Priority Data
Apr. 29, 2020 (CN) .......................... 202010355815.7

(51) Int. Cl.
*H10K 59/131* (2023.01)
*H01Q 1/22* (2006.01)
*H10K 59/12* (2023.01)

(52) U.S. Cl.
CPC ............. *H10K 59/131* (2023.02); *H01Q 1/22* (2013.01); *H10K 59/1201* (2023.02)

(58) Field of Classification Search
CPC ........... H01Q 1/22; H01Q 1/243; H01Q 1/38; H10K 59/131
See application file for complete search history.

(56) References Cited

U.S. PATENT DOCUMENTS

2007/0170505 A1  7/2007  Tokunaga
2015/0022081 A1  1/2015  Li
(Continued)

FOREIGN PATENT DOCUMENTS

CN  102749770 A  10/2012
CN  105824359 A  8/2016
(Continued)

*Primary Examiner* — Nduka E Ojeh
(74) *Attorney, Agent, or Firm* — PV IP PC; Wei Te Chung; Zhigang Ma

(57) ABSTRACT

The present application discloses an organic light-emitting display and a manufacturing method thereof. The organic light-emitting display includes a display panel, and the display panel includes a substrate layer, an organic light-emitting layer, a thin film encapsulation layer, and a thin film encapsulation layer, and an antenna disposed on an upper surface of the thin film encapsulation layer stacked sequentially from bottom to top. The size and position of the antenna are more flexible in design, and the antenna is directly placed on the thin film encapsulation layer, which dodges light-emitting pixels in the light-emitting layer, thereby avoiding the occurrence of Moire.

12 Claims, 4 Drawing Sheets

(56) References Cited

U.S. PATENT DOCUMENTS

| | | | |
|---|---|---|---|
| 2016/0334836 A1* | 11/2016 | Hong | ................... G06F 1/1681 |
| 2018/0188432 A1* | 7/2018 | Choi | ..................... H10K 50/86 |
| 2019/0220123 A1 | 7/2019 | Kanaya | |
| 2019/0250734 A1 | 8/2019 | Lee | |
| 2020/0258946 A1* | 8/2020 | Kim | ....................... H10K 59/38 |
| 2020/0266542 A1* | 8/2020 | Mu | ....................... H10K 59/00 |
| 2021/0132722 A1* | 5/2021 | Kim | ......................... H01Q 1/38 |
| 2021/0358996 A1* | 11/2021 | Lee | ....................... H10K 59/00 |

FOREIGN PATENT DOCUMENTS

| | | |
|---|---|---|
| CN | 107665914 A | 2/2018 |
| CN | 110034161 A | 7/2019 |
| CN | 209250615 U | 8/2019 |
| CN | 110941113 A | 3/2020 |

\* cited by examiner

```
┌─────────────────────────────────────────┐
│      providing the substrate layer;     │
└─────────────────────────────────────────┘
                    ⇩
┌─────────────────────────────────────────┐
│ sequentially forming the organic light- │
│ emitting layer and the thin film encapsulation │
│ layer on the substrate layer to form the│
│ display panel;                          │
└─────────────────────────────────────────┘
                    ⇩
┌─────────────────────────────────────────┐
│ forming a metal layer on the thin film  │
│ encapsulation layer; and                │
└─────────────────────────────────────────┘
                    ⇩
┌─────────────────────────────────────────┐
│ patterning the metal layer to form the  │
│ antenna.                                │
└─────────────────────────────────────────┘
```

FIG. 7

ORGANIC LIGHT-EMITTING DISPLAY INTEGRATING ANTENNA TRACE AND MANUFACTURING METHOD THEREOF

BACKGROUND OF INVENTION

Field of Invention

The present application relates to a field of display technology, in particular to an organic light-emitting display and a manufacturing method thereof.

Description of Prior Art

An existing transparent antenna for an OLED display panel, such as a metal grid antenna, usually needs to be fabricated on a separate transparent film substrate, and then pasted on an upper surface of a flexible OLED through transparent OCA adhesive, which is easy to cause poor appearance such as Morie patterns.

At present, the metal grid antenna separately fabricated on an additional transparent film substrate includes an opaque metal area at one end or a periphery of the metal grid antenna, and the opaque metal area includes a signal line and a ground line of the antenna. The signal line and the ground line need to be connected to a motherboard (Main Carrier Board) of an entirety of a device coplanar waveguide flexible print circuit through a coaxial transmission line (coplanar waveguide flexible print circuit, CPW FPC), whose structural design is more complicated and occupies more space.

In order to solve the deficiencies of the prior art, an object of the present application is to provide an organic light-emitting display and a manufacturing method thereof.

SUMMARY OF INVENTION

The present application provides an organic light-emitting display, including a display panel, wherein the display panel includes a substrate layer, an organic light-emitting layer, and a thin film encapsulation layer stacked sequentially from bottom to top, and the organic light-emitting display further includes an antenna disposed on an upper surface of the thin film encapsulation layer.

original translation 1

In some embodiments, the display panel includes a display area, the organic light-emitting layer includes a plurality of sub-pixels disposed side-by-side, the antenna includes a transparent trace area, the transparent trace area is located in the display area, and an orthographic projection of the transparent trace area on the organic light-emitting layer is between adjacent ones of the sub-pixels.

In some embodiments, the transparent trace area has a metal grid structure.

In some embodiments, the transparent trace area includes an antenna area for emitting and receiving electromagnetic wave signals and an open border area for shielding peripheral noise, the open border area is located at a periphery of the antenna area, and the antenna area and the open border area are separated by a fracture.

In some embodiments, the display panel further includes a non-display area disposed around the display area, the antenna includes an opaque metal area located in the non-display area, the opaque metal area is connected to a periphery of the transparent trace area, the display panel further includes a thin film transistor layer disposed between the substrate layer and the organic light-emitting layer, and the opaque metal area is electrically connected to the thin film transistor layer.

In some embodiments, the opaque metal area includes a signal line and a ground line, the signal line and the ground line are electrically connected to the thin film transistor layer, and are connected to a flexible circuit board through the thin film transistor layer.

In some embodiments, the antenna includes a plurality of groups of antennas selected from one or more of near-field communication antennas, Wi-Fi antennas, Bluetooth antennas, fifth-generation communication antennas, and global positioning system antennas.

The present application also provides method of manufacturing the organic light-emitting display according to claim 1, including the steps of: providing the substrate layer; sequentially forming the organic light-emitting layer and the thin film encapsulation layer on the substrate layer to form the display panel; forming a metal layer on the thin film encapsulation layer; and patterning the metal layer to form the antenna.

In some embodiments, the thin film encapsulation layer includes a first inorganic layer, an organic layer, a second inorganic layer, and a third inorganic layer deposited sequentially from bottom to top, and the metal layer is formed on the third inorganic layer.

In some embodiments, the manufacturing method further include a step of electrically connecting the antenna to a flexible circuit board, wherein the flexible circuit board is electrically connected to a motherboard of an entirety of the organic light-emitting display.

Compared with the prior art, the present application has the following beneficial effects and advantages:

The present application integrates the antenna trace directly above the effective display area of the organic light-emitting display, wherein the size of the antenna is no longer limited by the extremely limited space of the prior art, and the size and position of the antenna are more flexible in design, proving a better solution for future flexible or transparent wireless electronic products. The antenna is directly placed on the thin film encapsulation layer, which dodges light-emitting pixels in the light-emitting layer, thereby avoiding the occurrence of Moire. The antenna is invisible to a naked eye and replaces a metal antenna in a specific area outside the effective display area in a traditional smartphone. The antenna is prepared on an upper surface of the thin film encapsulation layer of the OLED, and directly extends down to the driving pixel substrate, so as to be electrically connected to the flexible circuit board, such that the flexible circuit board is electrically connected to a motherboard of an entirety of the display, wherein the flexible circuit board can be integrated with the flexible circuit board used for the display, that is the two are integrated into one, thereby making the manufacturing process simpler and the cost lower.

BRIEF DESCRIPTION OF DRAWINGS

FIG. 7 is a flowchart illustrating a method of manufacturing an organic light-emitting display according to an embodiment of the present application.

DETAILED DESCRIPTION OF PREFERRED EMBODIMENTS

The present application provides a physical keyboard input system, a keyboard input method, and a storage medium. In order to make the purpose, technical solutions, and effects of the present application clearer and clearer, the present application will be described in further detail below with reference to the accompanying drawings and embodiments. It should be understood that the specific embodiments described herein are only used to explain the present application, and are not used to limit the present application.

Embodiment

Figure 1:
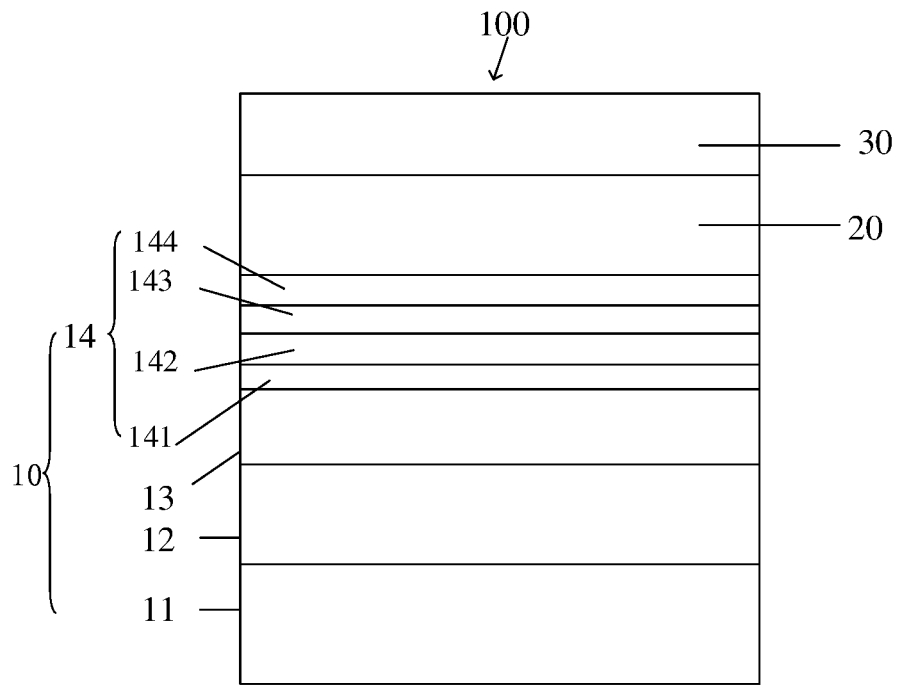
FIG. 1 is a schematic structural diagram illustrating an organic light-emitting display according to an embodiment of the present application.
Figure 2:
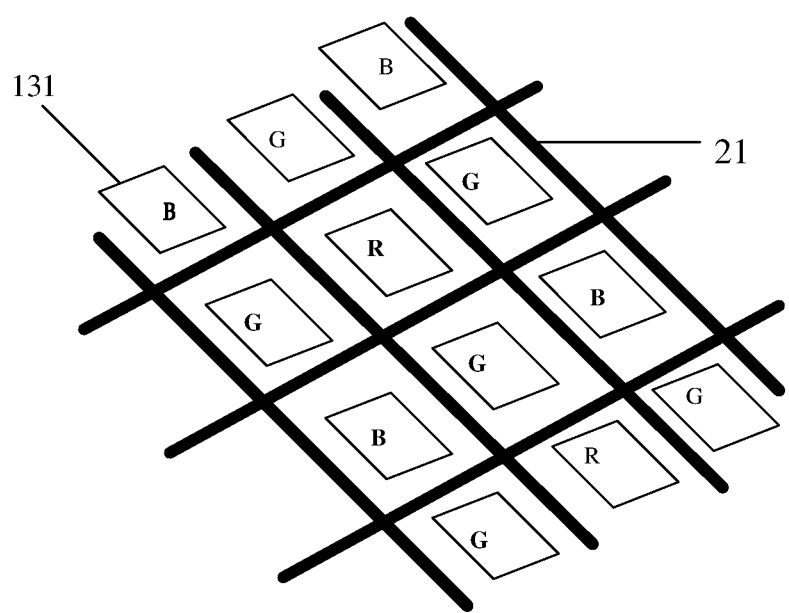
FIG. 2 is a schematic plan view of an antenna and sub-pixels of the organic light-emitting display of FIG. 1.
Figure 3:
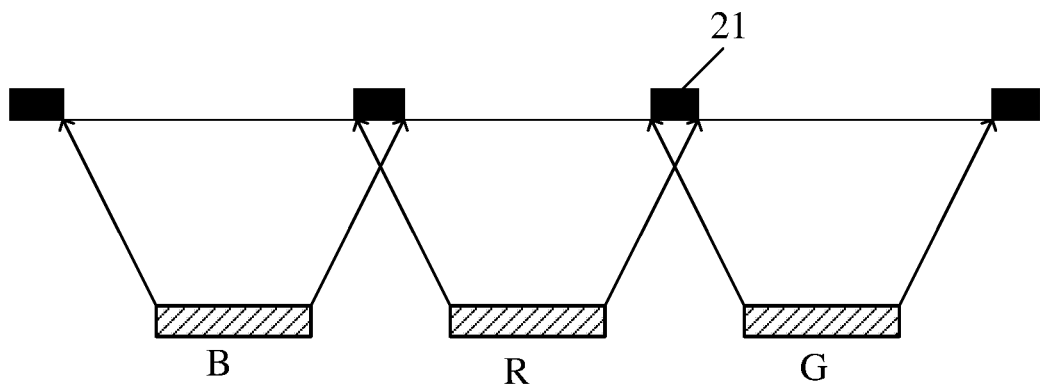
FIG. 3 is a schematic diagram showing the relative positional relationship between sub-pixels and a transparent trace area of the organic light-emitting display according to an embodiment of the present application.
Figure 4:
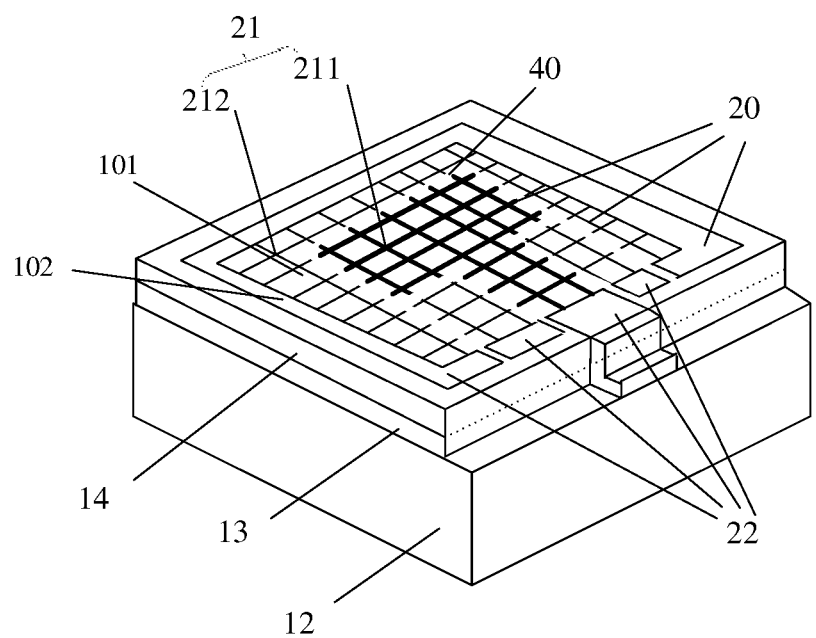
FIG. 4 is a schematic diagram illustrating a three-dimensional structure of an organic light-emitting display according to an embodiment of the present application.

This embodiment provides an organic light-emitting display 100. As shown in FIGS. 1 and 2, the organic light-emitting display 100 includes a display panel 10, an antenna 20 disposed above the display panel 10, and a touch control panel 30 disposed above the antenna 20. The display panel 10 includes a substrate original translation 4 layer 11, a thin-film transistor layer 12, an organic light-emitting layer 13, and a thin-film encapsulation layer 14 that are stacked sequentially from bottom to top. The organic light-emitting layer 13 includes a plurality of sub-pixels 131 disposed side-by-side. The plurality of sub-pixels 131 may include a red sub-pixel R, a blue sub-pixel B, and a green sub-pixel G The antenna 20 is integrated on an upper surface of the thin film encapsulation layer 14. As shown in FIGS. 3 and 4, the display panel 10 includes a display area 101 and a non-display area 102. The non-display area 102 is located at a periphery of the display area 101. The antenna 20 includes a transparent trace area 21 and an opaque metal area 22, wherein the transparent trace area has a metal grid structure, the opaque metal area 22 is connected to a periphery of the metal grid structure, the metal grid structure is located in the display area 101, and an orthographic projection of a grid line of the metal grid structure on the organic light-emitting layer 13 is between adjacent ones of the sub-pixels 131, that is, at a gap between the sub-pixels 131.

As shown in FIG. 4, the metal grid structure includes an antenna area 211 for emitting and receiving electromagnetic wave signals and an open border area 212 for shielding peripheral noise, the open border area 212 is located at a periphery of the antenna area 211, and the antenna area 211 and the open border area 212 are separated by a fracture 40.

The opaque metal area 22 is located in the non-display area 102. The antenna 20 is connected to the thin film transistor layer 12, that is, the array substrate. Specifically, the opaque metal area 22 is electrically connected to the array substrate, and the array substrate is then electrically connected to the flexible circuit board 50.

The opaque metal area 22 includes a signal line 221 and a ground line 222, and the signal line 221 is electrically connected to a signal line of the flexible circuit board 50; the ground line 222 is electrically connected to a ground line of the flexible circuit board 50, and the flexible circuit board 50 is then electrically connected to a motherboard 60 of an entirety of the organic light-emitting display.

Figure 5:
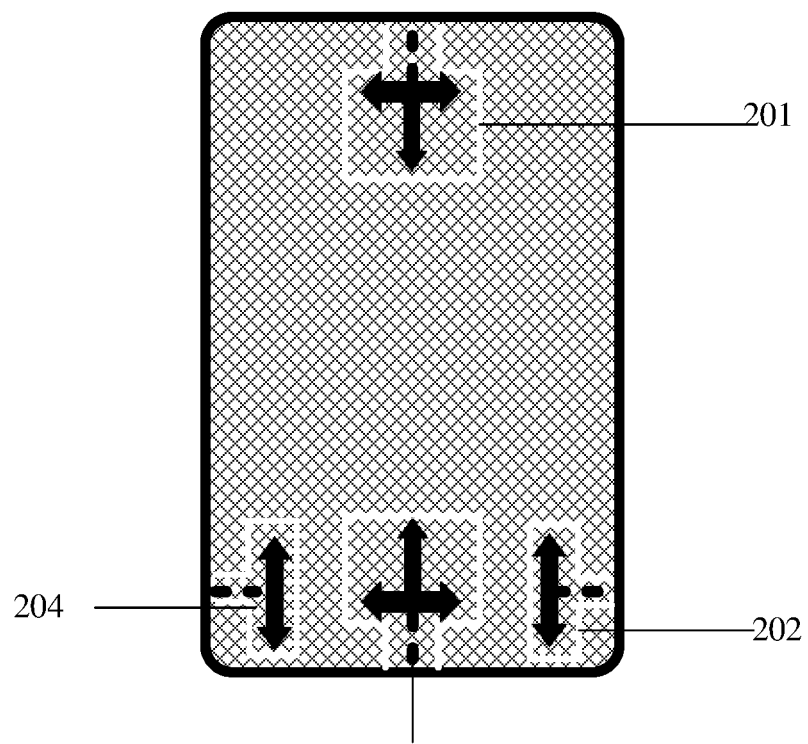
FIG. 5 is a schematic top view showing an antenna according to an embodiment of the present application.

As shown in FIG. 5, a full-surface metal grid structure is formed on the upper surface of the thin film encapsulation layer 14 of the OLED, and then a fracture 40 is set at a specific position correspondingly, to form a specific antenna area, wherein the antenna 20 includes a plurality of groups of antennas selected from one or more of Wi-Fi antennas/Bluetooth antennas 201, global positioning system (GPS) antenna 202, fifth-generation communication (5G) antenna 203, and near-field communication (NFC) antenna 204.

Another embodiment also provides a method of manufacturing an organic light-emitting display, as shown in FIG. 7, including the following steps: providing a substrate layer 11; and sequentially forming a thin film transistor layer 12, an organic light-emitting layer 13, and a thin film encapsulation layer 14 on the substrate layer 11. Specifically, the organic light-emitting display further includes a protective film and a double-layered polyimide layer sequentially from top to bottom. A light blocking layer (SiNx/SiOx) and a buffer layer (SiNx/SiOx) may also be provided on the substrate layer 11.

The thin film transistor layer 12 includes a semiconductor active layer p-Si, a gate insulating layer, and a gate layer, an interlayer dielectric layer, and a source/drain layer formed on the gate insulating layer.

The organic light-emitting layer 13 includes an anode layer, a light-emitting material layer, a cathode layer, and a pixel definition layer.

The thin-film encapsulation layer 14 includes a first inorganic layer 141, an organic layer 142, a second inorganic layer 143, and a third inorganic layer 144 stacked sequentially. A metal layer is formed on an entire surface of the third inorganic layer 144. Material of the metal layer includes copper; the first inorganic layer 141, the second inorganic layer 143, and the third inorganic layer 144 are formed into a film by chemical vapor deposition (CVD), and the third inorganic layer 144 includes SiNx/SiOx composite layer. The metal layer is fabricated by low-temperature sputtering, and the third inorganic layer serves as a buffer layer before the metal layer is fabricated on the thin-film encapsulation layer 14, to prevent the film of the encapsulation layer 14 from damage during directly sputtering the metal layer.

Figure 6:
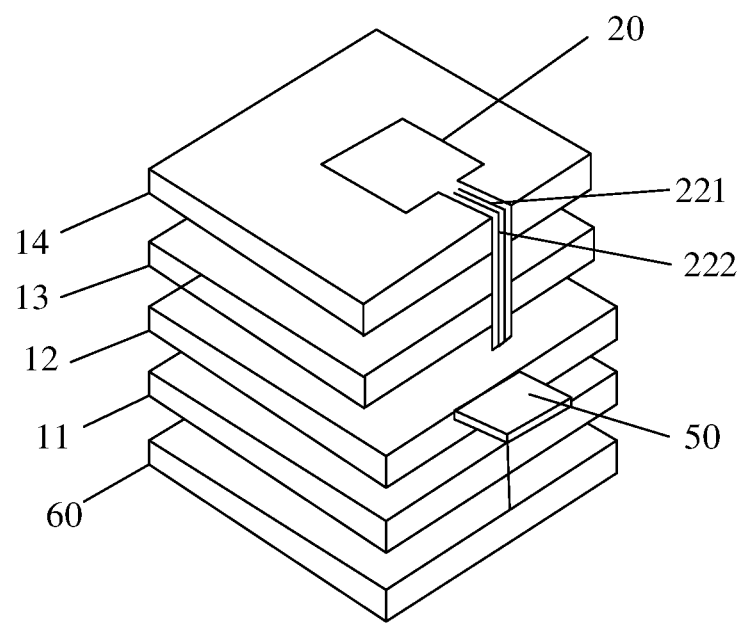
FIG. 6 is a schematic structural diagram illustrating an organic light-emitting display according to an embodiment of the present application.

A photoresist is coated on a surface of the metal layer, and a photomask with a preset pattern is used to pattern the entire surface of metal layer through processes, such as exposure, development, etching and so on, to form a hollow metal grid structure and a periphery opaque metal area. In the process of forming the metal grid structure, the fracture 40 is formed correspondingly at the predetermined position of a path and an open on the metal grid structure, and the antenna area 211 and the open border area 212 are separated by a fracture 40 to maintain electrical isolation. A resonant frequency of the antenna is regulated by adjusting a size of the antenna area 211 and the open border area 212;

The opaque metal area 22 passes through metal leads and via holes and extends down to the thin film transistor layer 12. As shown in FIG. 6, the thin film transistor layer 12 is connected to the flexible circuit board 50 through an anisotropic conductive adhesive (ACF). The flexible circuit board 50 is electrically connected to the motherboard 60 of an entirety of the display. The opaque metal area 22 includes a signal line 221 and a ground line 222. The signal line 221 is connected to a signal line of the flexible circuit board 50 through a thin film transistor, and the ground line 222 is connected to a ground line of the flexible circuit board 50.

A touch sensor 30 and A polarizer are sequentially attached on the antenna layer through an optical transparent adhesive to form the touch panel 30.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting display, comprising a display panel, wherein the display panel comprises a substrate layer, an organic light-emitting layer, and a thin film encapsulation layer stacked sequentially from bottom to top, and the organic light-emitting display further comprises an antenna disposed on an upper surface of the thin film encapsulation layer;
   wherein the display panel comprises a display area, the organic light emitting layer comprises a plurality of sub-pixels disposed side-by-side, the antenna comprises a transparent trace area, the transparent trace area is located in the display area, and an orthographic projection of the transparent trace area on the organic light-emitting layer is located between adjacent ones of the sub-pixels; and
   wherein the display panel further comprises a non-display area disposed around the display area, the antenna comprises an opaque metal area located in the non-display area, the opaque metal area is connected to a periphery of the transparent trace area, the display panel further comprises a thin film transistor layer disposed between the substrate layer and the organic light-emitting layer, and the opaque metal area is electrically connected to the thin film transistor layer.

2. The organic light emitting display according to claim 1, wherein the transparent trace area has a metal grid structure.

3. The organic light emitting display according to claim 1 wherein the transparent trace area comprises an antenna area for emitting and receiving electromagnetic wave signals and an open border area for shielding peripheral noise, the open border area is located at a periphery of the antenna area, and the antenna area and the open border area are separated by a fracture.

4. The organic light emitting display according to claim 1, wherein the opaque metal area comprises a signal line and a ground line, and the signal line and the ground line are electrically connected to the thin film transistor layer, and are connected to a flexible circuit board through the thin film transistor layer.

5. The organic light emitting display according to claim 1, wherein the antenna comprises a plurality of groups of antennas selected from near-field communication antennas, Wi-Fi antennas, Bluetooth antennas, fifth-generation communication antennas, and/or global positioning system antennas.

6. A method of manufacturing an organic light-emitting display of claim 1, comprising steps of:
   providing the substrate layer;
   sequentially forming the organic light-emitting layer and the thin film encapsulation layer on the substrate layer to form the display panel;
   forming a metal layer on the thin film encapsulation layer; and
   patterning the metal layer to form the antenna;
   wherein the display panel comprises a display area, the organic light emitting layer comprises a plurality of sub-pixels disposed side-by-side, the antenna comprises a transparent trace area, the transparent trace area is located in the display area, and an orthographic projection of the transparent trace area on the organic light-emitting layer is located between adjacent ones of the sub-pixels; and
   wherein the display panel further comprises a non-display area disposed around the display area, the antenna comprises an opaque metal area located in the non-display area, the opaque metal area is connected to a periphery of the transparent trace area, the display panel further comprises a thin film transistor layer disposed between the substrate layer and the organic light-emitting layer, and the opaque metal area is electrically connected to the thin film transistor layer.

7. The method of manufacturing the organic light-emitting display according to claim 6, wherein the thin film encapsulation layer comprises a first inorganic layer, an organic layer, a second inorganic layer, and a third inorganic layer deposited sequentially from bottom to top, and the metal layer is formed on the third inorganic layer.

8. The method of manufacturing the organic light-emitting display according to claim 6, further comprising a step of electrically connecting the antenna to a flexible circuit board, wherein the flexible circuit board is electrically connected to a motherboard of an entirety of the organic light-emitting display.

9. The method of manufacturing the organic light-emitting display according to claim 6, wherein the transparent trace area has a metal grid structure.

10. The method of manufacturing the organic light-emitting display according to claim 6, wherein the transparent trace area comprises an antenna area for emitting and receiving electromagnetic wave signals and an open border area for shielding peripheral noise, the open border area is located at a periphery of the antenna area, and the antenna area and the open border area are separated by a fracture.

11. The method of manufacturing the organic light-emitting display according to claim 6, wherein the opaque metal area comprises a signal line and a ground line, and the signal line and the ground line are electrically connected to the thin film transistor layer, and are connected to a flexible circuit board through the thin film transistor layer.

12. The method of manufacturing the organic light-emitting display according to claim 6, wherein the antenna comprises a plurality of groups of antennas selected from near-field communication antennas, Wi-Fi antennas, Bluetooth antennas, fifth-generation communication antennas, and/or global positioning system antennas.

* * * * *